United States Patent
Kobayashi et al.

(10) Patent No.: US 10,090,062 B2
(45) Date of Patent: Oct. 2, 2018

(54) MAGNETIC MEMORY DEVICE AND CONTROLLING METHOD THEREOF

(71) Applicant: TOSHIBA MEMORY CORPORATION, Tokyo (JP)

(72) Inventors: Shinya Kobayashi, Kawasaki Kanagawa (JP); Kenji Noma, Yokohama Kanagawa (JP); Mikio Miyata, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/620,295

(22) Filed: Jun. 12, 2017

(65) Prior Publication Data
US 2017/0365357 A1 Dec. 21, 2017

(30) Foreign Application Priority Data
Jun. 16, 2016 (JP) .................................. 2016-119866

(51) Int. Cl.
| G11C 11/00 | (2006.01) |
| G11C 29/38 | (2006.01) |
| H01L 43/02 | (2006.01) |
| H01L 43/08 | (2006.01) |
| H01L 27/22 | (2006.01) |
| G11C 11/16 | (2006.01) |

(52) U.S. Cl.
CPC ............ *G11C 29/38* (2013.01); *G11C 11/161* (2013.01); *G11C 11/1673* (2013.01); *G11C 11/1675* (2013.01); *H01L 27/228* (2013.01); *H01L 43/02* (2013.01); *H01L 43/08* (2013.01)

(58) Field of Classification Search
CPC ...... G11C 11/15; G11C 11/16; G11C 11/1673; G11C 11/1675; G11C 29/12; G11C 13/0004; G11C 13/0069; G11C 2013/009; G11C 2029/1202; G11C 29/021; G11C 29/023; G11C 29/026; G11C 29/028
USPC .......... 365/158, 171, 173, 189.15, 148, 200, 365/201, 210.1, 96
See application file for complete search history.

(56) References Cited

U.S. PATENT DOCUMENTS

| 6,563,743 B2 | 5/2003 | Hanzawa et al. |
| 6,683,807 B2 | 1/2004 | Hidaka |

(Continued)

FOREIGN PATENT DOCUMENTS

| JP | 2003217277 A | 7/2003 |
| JP | 2005236177 A | 9/2005 |
| JP | 2010267373 A | 11/2010 |

*Primary Examiner* — Thong Q Le
(74) *Attorney, Agent, or Firm* — Patterson & Sheridan, LLP

(57) ABSTRACT

A magnetic memory device includes a memory cell array comprising memory cells including magnetic tunnel junction elements. Each memory cell is electrically connected between a source line and a bit line. A control circuit is configured to perform a screening test on the memory cell array before writing data to the memory cell array. The screening test determines whether an abnormal cell is present in the memory cell array. The controller applies a first writing voltage to the write data to the memory cell array if the abnormal cell is not present, or applies a second writing voltage to write data to the memory cell array if the abnormal cell is present. The second writing voltage is different from the first writing voltage.

17 Claims, 14 Drawing Sheets

(56) References Cited

U.S. PATENT DOCUMENTS

| | | |
|---|---|---|
| 6,713,830 B2 | 3/2004 | Nishimura et al. |
| 7,272,032 B2 | 9/2007 | Tsuji |
| 2014/0157065 A1* | 6/2014 | Ong .................. G11C 29/12 |
| | | 714/718 |

* cited by examiner

MAGNETIC MEMORY DEVICE AND CONTROLLING METHOD THEREOF

CROSS-REFERENCE TO RELATED APPLICATIONS

This application is based upon and claims the benefit of priority Japanese Patent Application No. 2016-119866, filed Jun. 16, 2016, the entire contents of which are incorporated herein by reference.

FIELD

Embodiments described herein relate generally to a magnetic memory device and a method of controlling magnetic memory.

BACKGROUND

MRAM (Magnetic Random Access Memory) is a rewritable nonvolatile memory. MRAM comprises a magnetic tunnel junction element using a magnetoresistive effect as a memory cell.

DETAILED DESCRIPTION

In general, according to one embodiment, a magnetic memory device includes a memory cell array comprising memory cells including magnetic tunnel junction elements. Each memory cell is electrically connected between a source line and a bit line. A control circuit is configured to perform a screening test on the memory cell array before writing data to the memory cell array. The screening test determines whether an abnormal cell is present in the memory cell array. The controller applies a first writing voltage to the write data to the memory cell array if the abnormal cell is not present, or applies a second writing voltage to write data to the memory cell array if the abnormal cell is present. The second writing voltage is different from the first writing voltage.

Embodiment 1

A first embodiment will be described with reference to FIG. 1 to FIG. 5.

Figure 1:
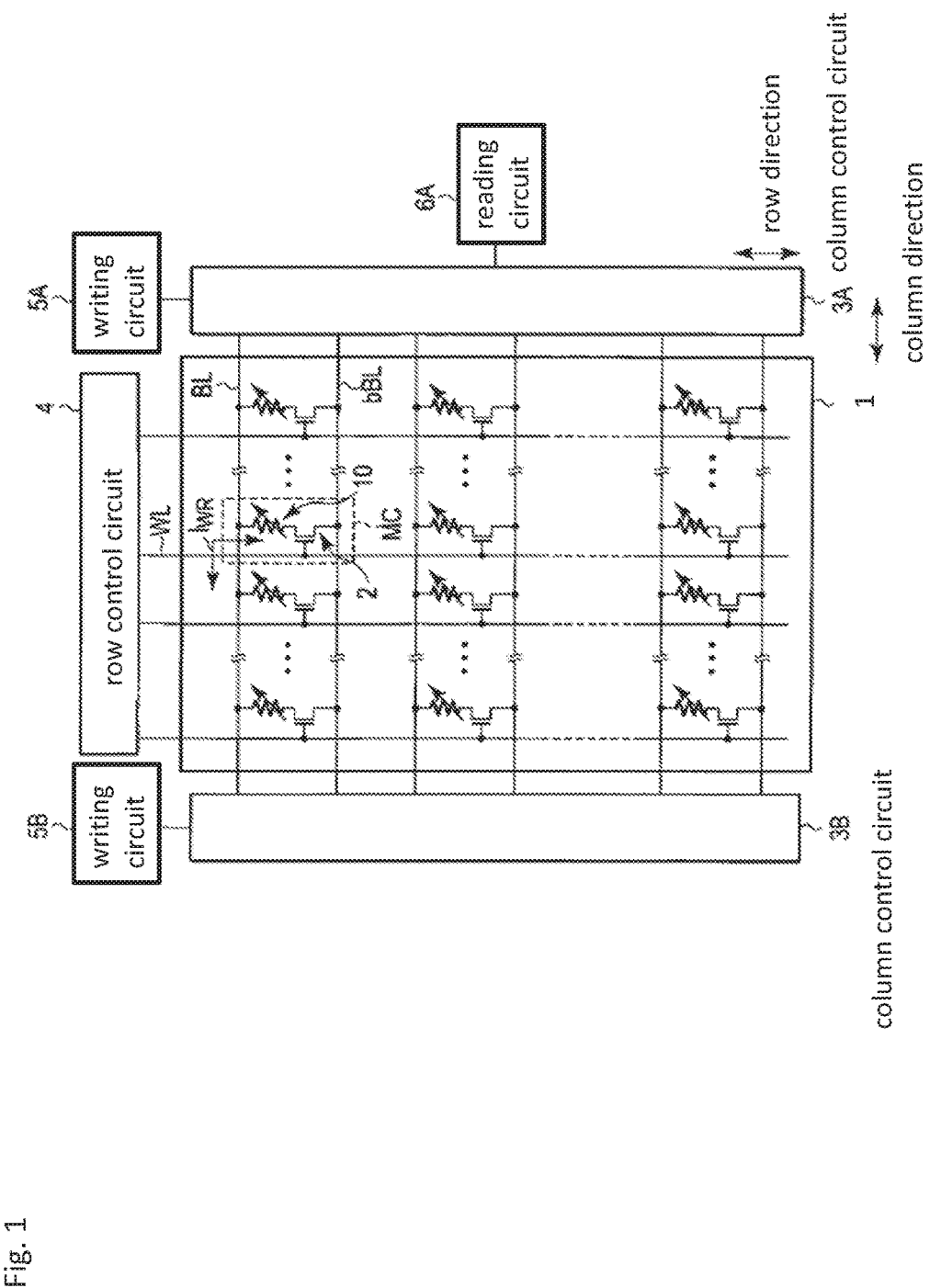
FIG. 1 is an illustration of a magnetic memory device according to first to second embodiments.

FIG. 1 is a schematic diagram showing an example of a memory cell array and a circuit near the memory cell array.

As shown in FIG. 1, there are a plurality of bit lines, BL and bBL, and a plurality of word lines WL in the memory cell array 1. The bit lines (BL and bBL) extend in a column direction and the word lines (WL) extend in a row direction. The bit line BL and the bit line bBL form a pair of bit lines (also referred to as a bit line pair).

The memory cell array 1 includes a plurality of memory cells MC. The memory cells are arranged in an array-shaped layout (e.g., rows and columns, as depicted in FIG. 1) in the memory cell array. Each memory cell MC is connected to one bit line pair (BL, bBL) and one wordline (WL). The memory cells arranged in column direction are commonly connected to the same pair of bit lines, BL and bBL. The memory cells arranged in row direction are commonly connected to the same word line WL.

For example, the memory cell MC includes a magnetic tunnel junction element 10 and a selecting switch 2. But, the memory cell MC is not necessarily limited to this particular structure.

The selecting switch 2 may be a field effect transistor, for example. In this example, the selecting transistor 2 is a field effect transistor, but this is not a requirement.

One end of the magnetic tunnel junction element 10 is connected to the bit line BL, and the other end is connected to one end of a current path (source or drain) of the selecting transistor 2. The other end of the current path of the selecting transistor 2 is connected to the bit line bBL. A control terminal (e.g., gate) of the selecting transistor 2 is connected to the word line WL.

An end of the word line is connected to a row control circuit 4. The row control circuit 4 controls activation or deactivation of the word line WL based on an address signal received from the outside. The bit lines BL and bBL are connected between a column control circuit 3A and a column control circuit 3B. The column control circuits 3A and 3B together control activation or deactivation of bit lines BL and bBL based on an address signal from outside. In this context, activation/deactivation of word lines WL and bit lines BL and bBL includes application of particular voltages and/or currents associated with operations with the memory cells MC.

A writing circuit 5A is connected to one end of bit lines BL and bBL via the column control circuit 3A. A writing circuit 5B is connected to the other end of bit lines BL and bBL via the column control circuit 3B. Each of the writing circuits 5A and 5B includes a source circuit, which is a current source generating a write current and a voltage source, and a sinking circuit, which is a current sink absorbing the write current.

A reading circuit 6A is connected to bit lines BL and bBL via the column control circuits 3A and 3B. The reading circuit 6A includes a voltage source and a current source for generating a read current, a sense amplifier for detecting a read signal and amplifying the read signal, and a latch circuit for holding data temporarily.

Note, FIG. 1 shows that reading circuit 6A is provided only on one side (right page side of FIG. 1) of the memory cell array in the column direction. But two reading circuits 6A (or two portions of reading circuit 6A) can be provided on the two sides of the memory cell array in the column direction.

A peripheral circuit or circuits other than the row and column control circuits, the writing circuit, and the reading circuit can be provided in the chip with the memory cell array 1 is provided. For example, a buffer circuit, a state machine (a control circuit), and an ECC (an error checking and correcting) circuit can provided in the chip as peripheral circuits.

Figure 2:
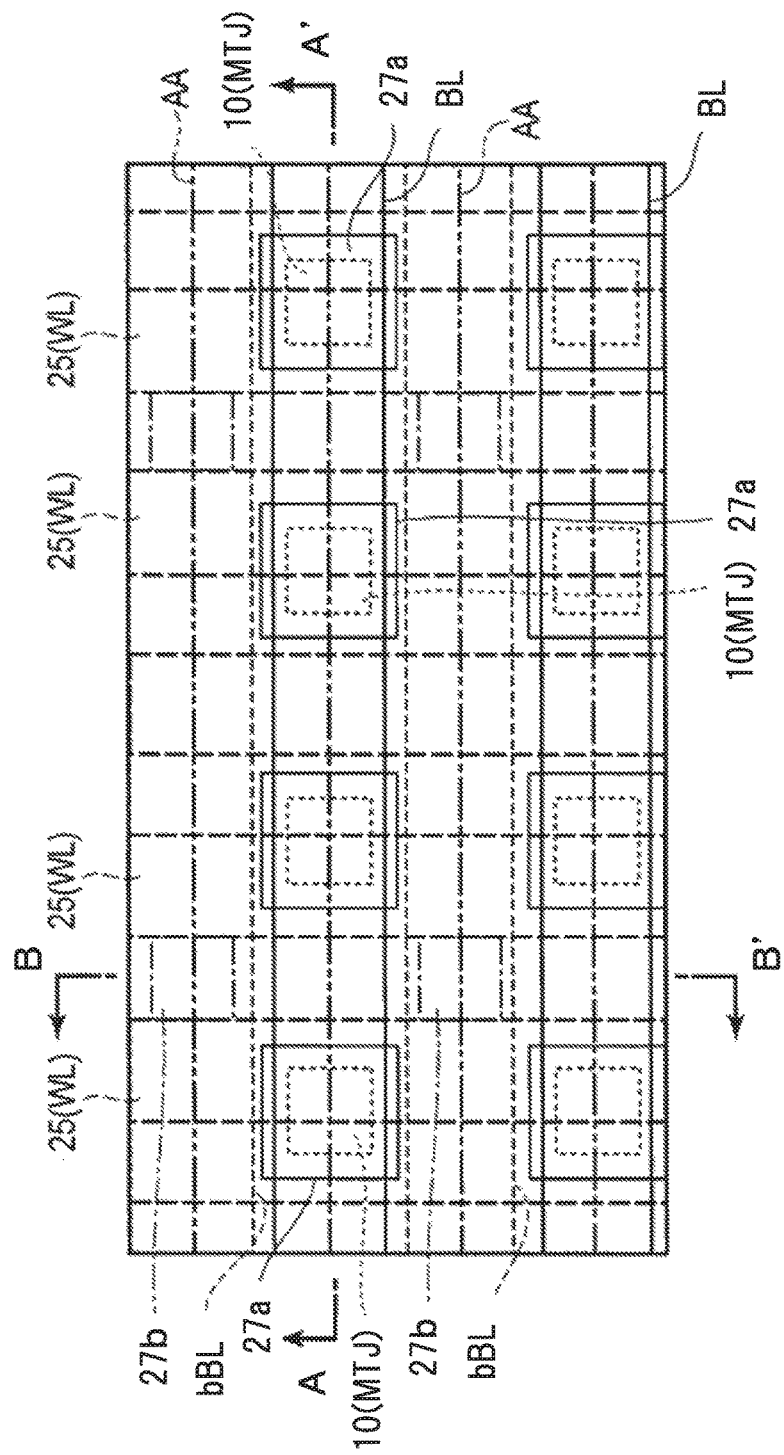
FIG. 2 is a plan view showing a memory cell array according to first to third embodiments.
Figure 3:
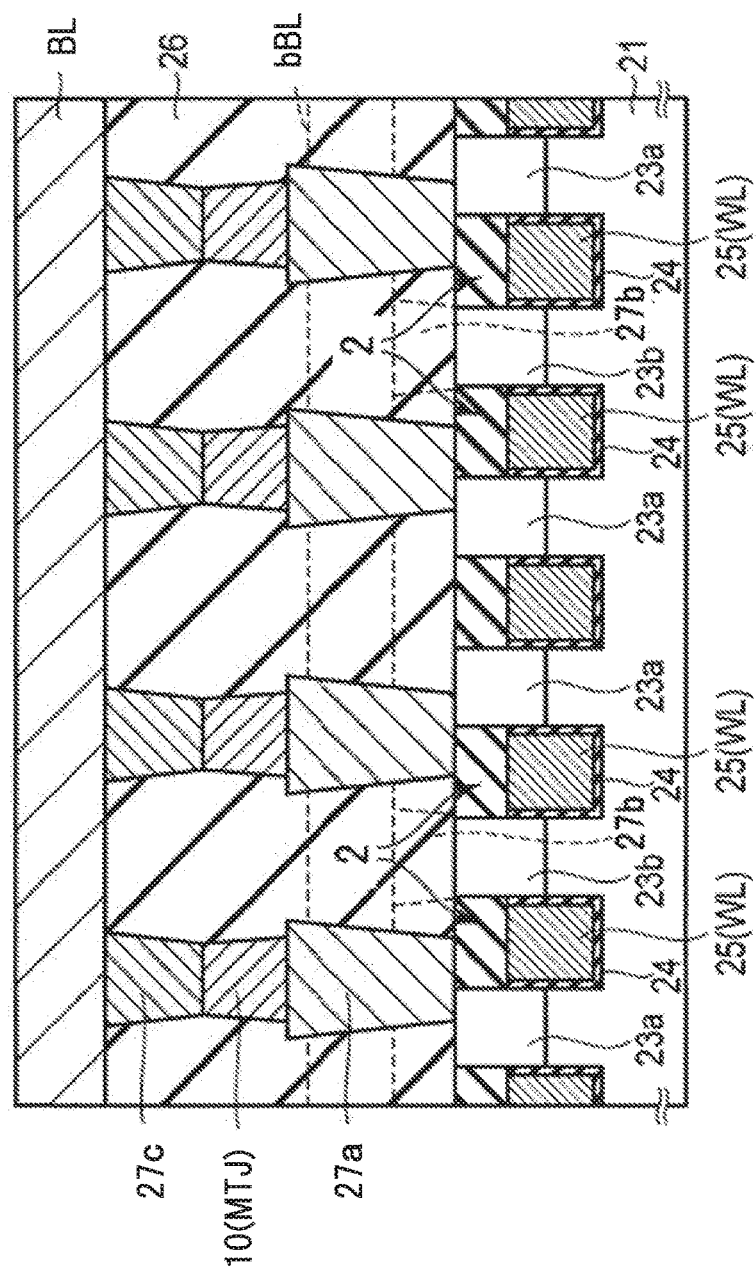
FIG. 3 is a cross-sectional view seen along cut A-A' of FIG. 2.
Figure 4:
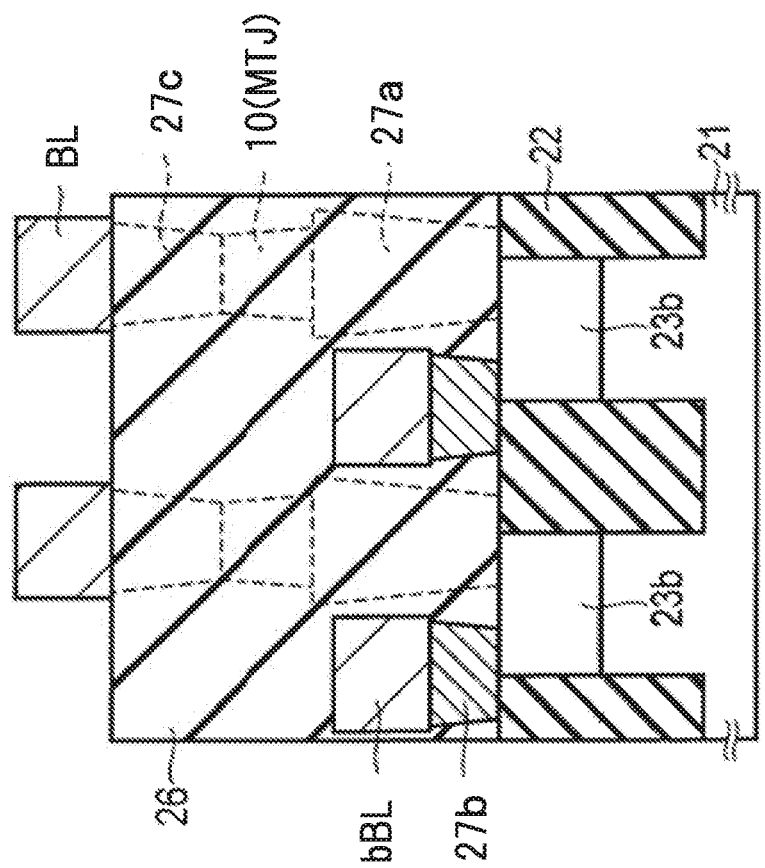
FIG. 4 is a cross-sectional view seen along cut B-B' of FIG. 2.

FIG. 2 is a plan view showing the memory cell array of FIG. 1. FIG. 3 is a cross-sectional view seen along cut A-A' of FIG. 2. FIG. 4 is a cross-sectional view seen along cut B-B' of FIG. 2.

In this first embodiment, the selecting transistor 2 is provided in an active area AA of a semiconductor substrate 21. The active area AA is separated by an isolation insulating film 22 buried in an isolation region. In this first embodiment, the isolation insulating film 22 is a STI (a Shallow Trench Isolation) structure.

The selecting transistor 2 comprises a source/drain diffusion layer 23a/23b in the semiconductor substrate 21, and a gate insulating film 24 and a gate electrode 25 (here, also serving as a word line WL) provided between the source/drain diffusion layer in the semiconductor substrate. For example, the selecting transistor 2 has a buried gate structure, that is, the gate electrode 25 is buried in the semiconductor substrate 21.

An interlayer insulating film 26 (e.g., a silicon oxide film) covers the selecting transistor 2. Contact plugs 27a, 27b are provided in the interlayer insulating film 26. The contact plugs 27a/27b are connected to the source/drain diffusion layers 23a/23b. The contact plugs 27a, 27b comprise any one of W, Ta, TaN and TiN, for example.

The magnetic tunnel junction element 10 is provided on the contact plug 27a. And the contact plug 27c is provided on the magnetic tunnel junction element 10.

The bit line BL is connected to the magnetic tunnel junction element 10 via the contact plug 27c. Here, the bit line bBL also functions as a source line SL by which a ground potential is applied during a reading operation.

The structure of the selecting transistor 2 is not limited to the structure depicted in FIG. 3. For example, a field effect transistor having a planar structure, and a field effect transistor having a three-dimensional structure such as a RCAT (Recess Channel Array Transistor) structure or a FinFET structure can be employed as the selecting transistor 2. A RCAT structure has a structure in which the gate electrode is buried in a trench (recess) via a gate insulating film. A FinFET has a structure in which the gate electrode intersects a strip-shaped semiconductor region in three dimensions via a gate insulating film.

Figure 5:
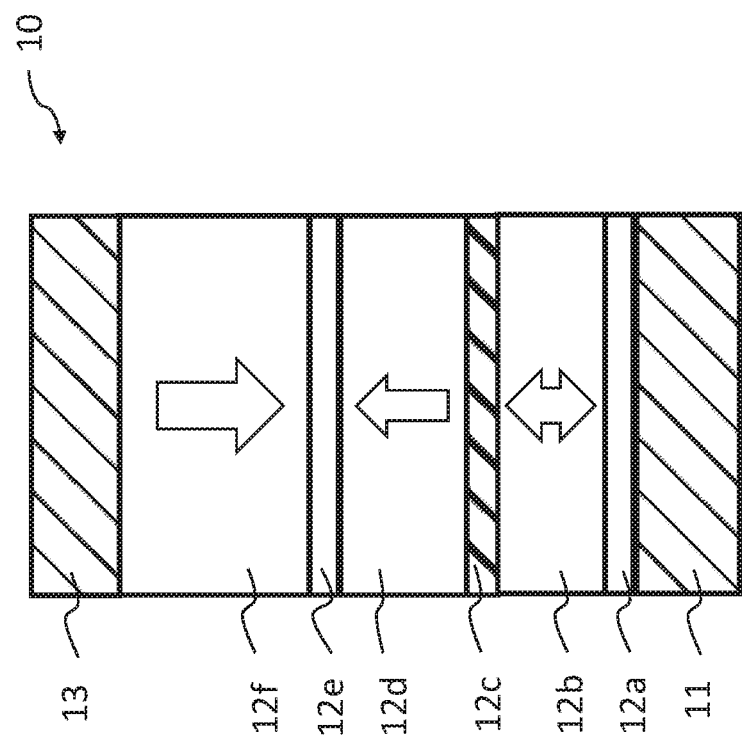
FIG. 5 is a cross-sectional view showing a magnetic tunnel junction element according to first to third embodiments.

FIG. 5 is a cross-sectional view showing an example of a magnetic tunnel junction element 10 according to first embodiment. As shown in FIG. 5, the magnetic tunnel junction element 10 comprises an under layer 12a provided between a lower electrode 11 and an upper electrode 13, a storage layer 12b, a tunnel barrier layer 12c, a reference layer 12d and a shift-cancelling layer 12f.

The under layer 12a is provided on the lower electrode 11. For example, the under layer 12a comprises tungsten. Furthermore, the under layer 12a can be omitted in some examples. The under layer 12a and the lower electrode 11 can be a single, integrated layer.

The storage layer 12b is provided on the under layer 12a. The storage layer 12b comprises a ferromagnetic layer having a variable magnetization direction which is perpendicular or nearly perpendicular to a main surface of the layer. Herein, the variable magnetization direction means the magnetization direction is changeable by a write current. Here, nearly perpendicular means a direction of a residual magnetization relative to the main surface is between 45 degrees and 90 degrees.

For example, the storage layer 12b comprises a ferromagnetic layer including cobalt or iron. Furthermore, the storage layer 12b can comprise nickel, for example. And boron can be added to the storage layer 12b to adjust saturation magnetization or magneto crystalline anisotropy.

The tunnel barrier layer 12c is provided on the storage layer 12b. The tunnel barrier layer 12c is a nonmagnetic layer including magnesium oxide, for example.

The reference layer 12d is provided on the tunnel barrier layer 12c. The reference layer 12d comprises a ferromagnetic layer having an invariable magnetization direction that is perpendicular or nearly perpendicular to the main surface of the reference layer 12d. Herein, an invariable magnetization direction means the magnetization direction is unchanged by application of a write current. In general, the reference layer 12d has a larger switching energy barrier than the storage layer 12b.

For example, the reference layer 12d comprises a ferromagnetic layer including cobalt or iron. Furthermore, the reference layer 12d can comprise nickel. And boron is added to the reference layer 12d in order to adjust saturation magnetization or magneto crystalline anisotropy.

The shift-cancelling layer 12f is provided on the reference layer 12d via a spacer layer 12e (for example, ruthenium). The shift-cancelling layer 12f comprises a ferromagnetic layer having an invariable magnetization direction that is perpendicular or nearly perpendicular to the main surface of the shift-cancelling layer 12f. And the magnetization direction of the shift-cancelling layer 12f is opposite to the magnetization direction of the reference layer 12d. With this arrangement, the shift-cancelling layer 12f can serve to cancel a stray magnetic field of the storage layer 12b from the reference layer 12d. The shift-cancelling layer 12f has the effect of adjusting the offset of the switching property of the storage layer 12b to an opposite direction, the offset is caused by the stray magnetic field from the reference layer 12d. The shift-cancelling layer 12f comprises cobalt-platinum (CoPt) or cobalt-nickel (CoNi), for example. The upper electrode 13 is provided on the shift-cancelling layer 12f.

A planar shape of the under layer 12a, the storage layer 12b, the tunnel barrier layer 12c, the reference layer 12d and the shift cancelling layer 12f is a circle, for example, when viewed along a direction substantially perpendicular to the main surface of the lower electrode 11. So, the magnetic tunnel junction element 10 is shaped like a pillar. But it is not necessarily limited to this shape. In other examples, the planar shape of the magnetic tunnel junction element 10 can be a square, a rectangle, or an ellipse.

For example, in this first embodiment, the magnetization direction of the reference layer 12d is fixed upward (e.g., in a direction toward the upper electrode 13) and the shift-cancelling layer 12f is fixed to downward (e.g., in a direction toward the lower electrode 11).

In some examples, an interfacial layer can be provided at the interface between the reference layer 12d and the tunnel barrier layer 12c, though the interfacial layer is not specifically illustrated in FIG. 5. This interfacial layer lattice-matches with the tunnel barrier layer 12c. For example, the interfacial layer comprises the same material(s) as the reference layer 12d, but the composition ratios of the interfacial layer and the reference layer can be different.

Also, there can be a size difference between the storage layer 12b and the reference layer 12d within their respective layer planes. For example, the reference layer 12d can have a smaller diameter in its layer plane than the storage layer 12b.

Furthermore, in some examples, the arrangement of the storage layer 12b and the reference layer 12d can be reversed. So, the reference layer 12d, the tunnel barrier layer 12c and the storage layer 12b can be provided in sequence on the lower electrode 11

Next, an example of a write operation and a read operation of the magnetic tunnel junction element 10 will be described.

The magnetic tunnel junction element 10, for example, is a spin transfer torque type magnetoresistive element. So in writing a data in the magnetic tunnel junction element 10 or reading a data from the magnetic tunnel junction element 10, a bidirectional current is supplied to the magnetic tunnel junction element 10 in the perpendicular direction of the main surface.

The write operation of the magnetic tunnel junction element 10 is performed in an example as follows.

Figure 6B:
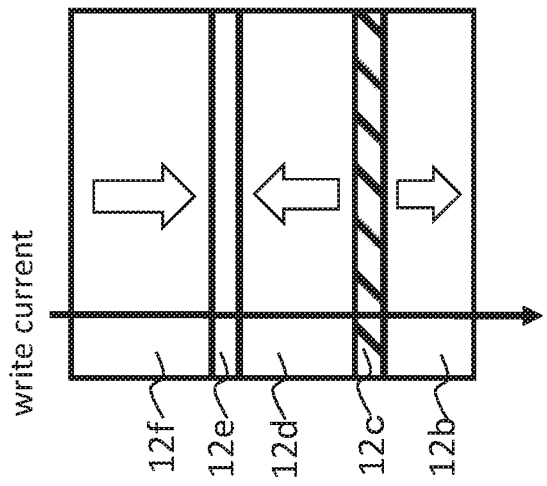
FIG. 6A and FIG. 6B are illustrations depicting aspects of a write operation of a magnetic memory device according to first to third embodiments.
Figure 6A:
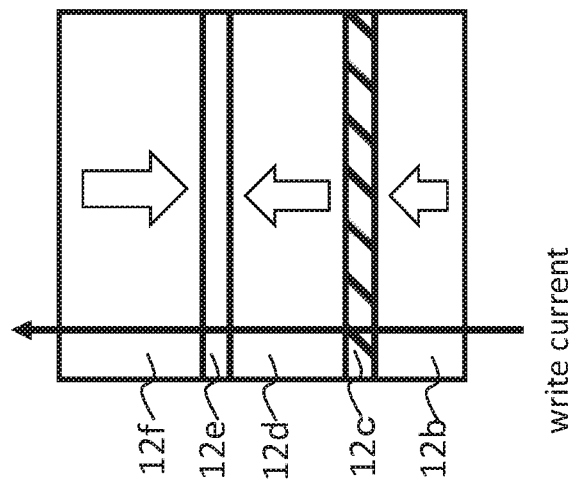

FIG. 6A is an illustration for showing aspects of the write operation of the magnetic tunnel junction element 10 and a cross-sectional view of the magnetic tunnel junction element 10 in a parallel state. FIG. 6B is an illustration for showing aspects of the write operation of the magnetic tunnel junction element 10 and a cross-sectional view of the magnetic tunnel junction element 10 in an anti-parallel state. In FIG. 6A and FIG. 6B, the upper electrode 13, the lower electrode 11 and the under layer 12a are omitted for simplicity in explanation. These elements are likewise similarly omitted in all subsequent depictions of the magnetic tunnel junction element 10.

The write circuits 5A and 5B supply a write current to a selected memory cell (a selected cell) in the writing operation. A writing voltage V1 is used 1.2V, for example. The selected cell is selected by an external component, for example, such as a host device.

The write circuits 5A and 5B supply the write current to the magnetic tunnel junction element 10 bidirectionally based on the data to be written to the selected cell in the writing operation. So the write circuits 5A and 5B supply the write current from the bit line BL to the bit line bBL, or the write current from the bit line bBL to the bit line BL based on the data being written to the magnetic tunnel junction element 10.

When a current flows from the lower electrode 11 to the upper electrode 13, that is, electrons are supplied from the upper electrode 13 to the lower electrode 11 (the electron notionally travels from the reference layer 12d to the storage layer 12b), a spin-polarized electron whose direction is same as the reference layer 12d is injected to the storage layer 12b. In this case, the direction of magnetization of the storage layer 12b is aligned with the reference layer 12d. After that, the directions of magnetization of the reference layer 12d and the storage layer 12b are parallel. In the parallel state a resistance value of the magnetic tunnel junction element 10 is low. This state is prescribed as a "0-data", for example (M0 in FIG. 8).

On the other hand, when a current flows from the upper electrode 13 to the lower electrode 11, that is, electrons are supplied from the lower electrode 11 to the upper electrode 13 (the electron notionally travels from the storage layer 12b to the reference layer 12d), a spin-polarized electron whose direction is opposite of the reference layer 12d is injected to the storage layer 12b due to a reflection effect of the reference layer 12d. In this case, the direction of magnetization of the storage layer 12b is aligned with the opposite direction of the reference layer 12d. After that, the directions of magnetization of the reference layer 12d and the storage layer 12b are anti-parallel. In the anti-parallel state a resistance value of the magnetic tunnel junction element 10 is high. This state is prescribed as a "1-data", for example (M11 in FIG. 8).

A read operation of the magnetic tunnel junction element 10 is performed as follows.

A read circuit 6A supplies a read current to the selected cell in the reading operation. A read current is set below the write current (threshold of magnetization switching current) to prevent a magnetization reversal of the storage layer 12b by the read current.

A current value or a potential at a read node varies based on the resistance value of the magnetic tunnel junction element 10. The data stored in the magnetic tunnel junction element 10 is determined to be "0-data" (binary value "0") or "1-data" (binary value "1"), based on the variation amount (a read signal or a read output) that depends on the resistance state of the magnetic tunnel junction element 10.

Figure 7:
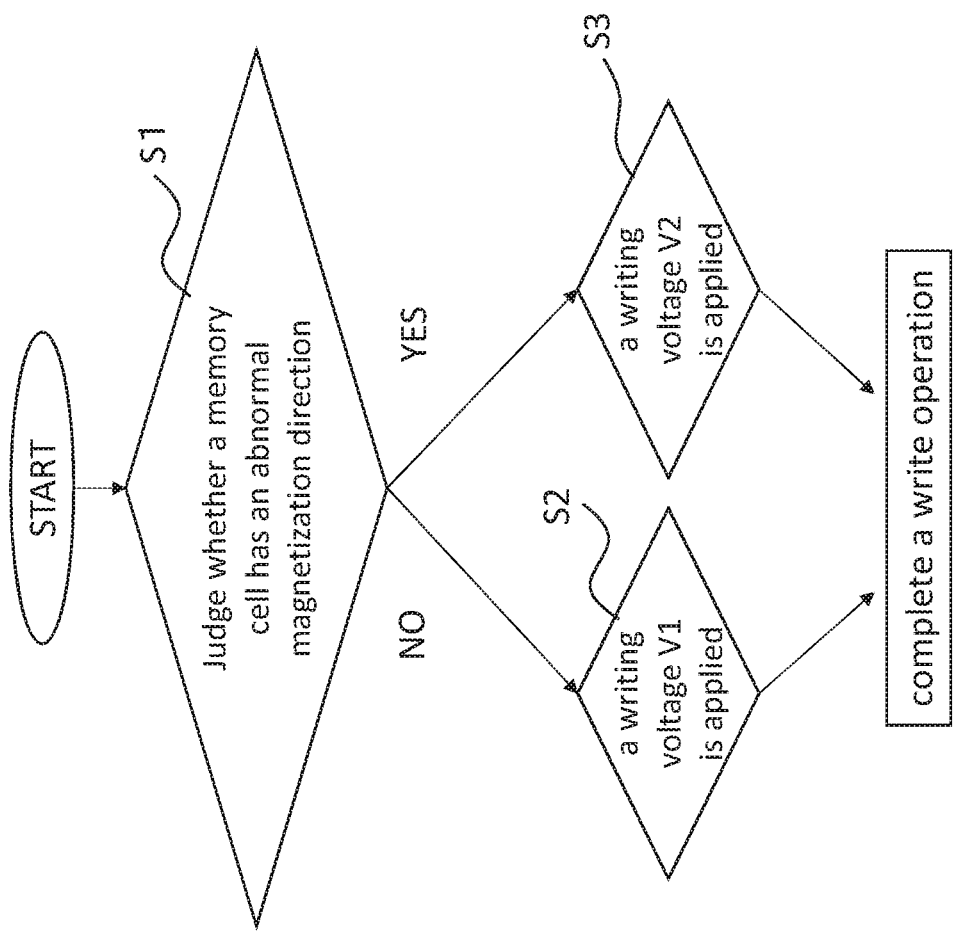
FIG. 7 is a flow chart of aspects of a write operation of a magnetic memory device according to first embodiment.

Next, certain aspects of the write operation according to the first embodiment will be described by reference to FIG. 7 to FIG. 10. FIG. 7 is a flow chart showing the write operation according to the first embodiment.

As can be seen in FIG. 7, it is judged before writing is attempted whether the memory cell has an abnormal magnetization direction or not (S1).

Whether there is an abnormal cell or not can be judged by a screening test, for example.

Figure 8:
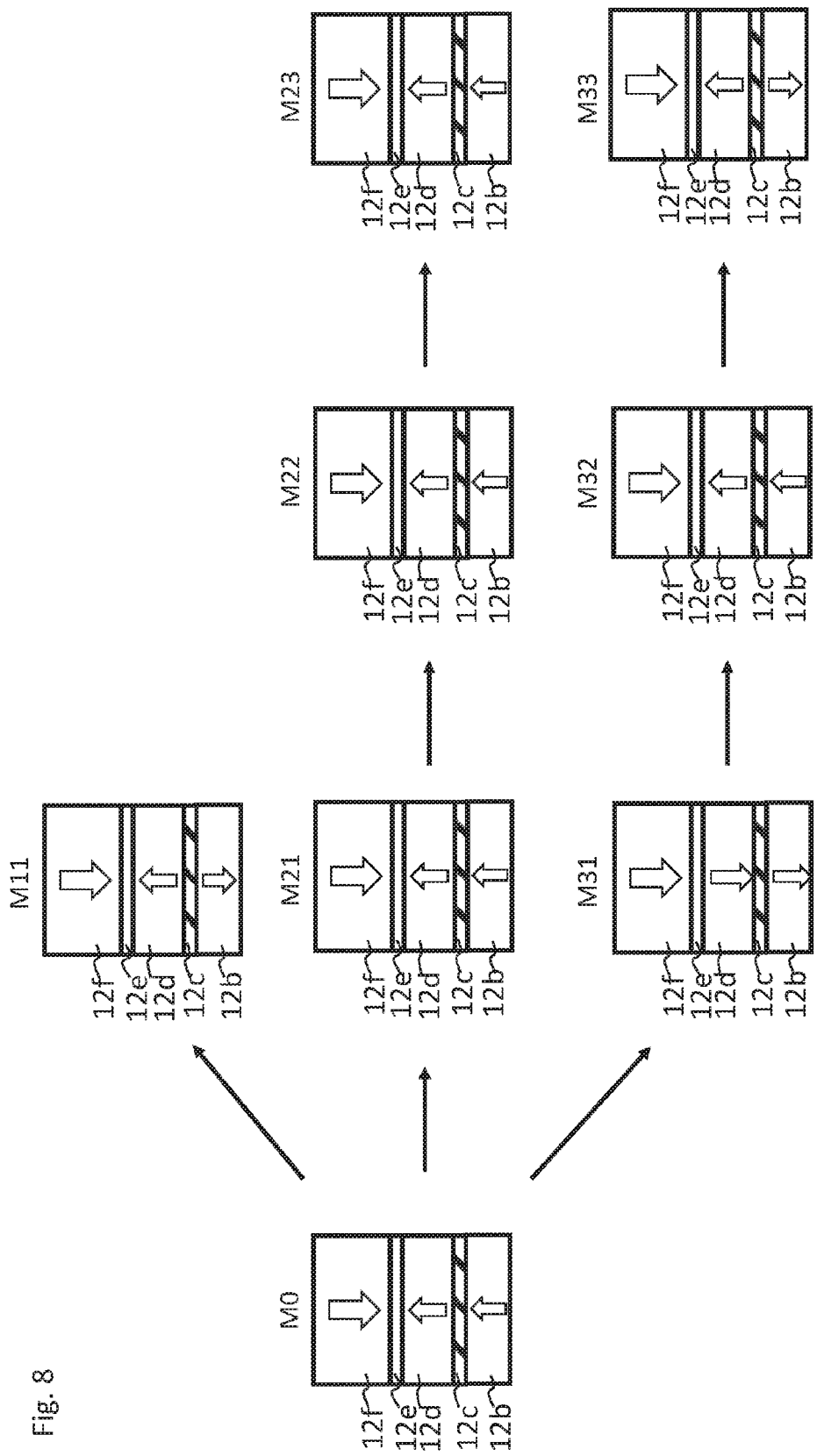
FIG. 8 is an illustration depicting aspects of a screening method according to first to third embodiments.

An example of a screening test for an abnormal cell is shown in FIG. 8.

As shown in FIG. 8, a writing voltage for a 1-state is applied to all the memory cells M0 that are in a 0-state in the memory cell array 1 so as to reverse the magnetization direction of the storage layer 12b. At this time the application of the writing voltage is performed under the condition that the magnetization direction of the reference layer 12d as well as the storage layer 12b reverses easily, for example, repeat of the write operation, rise of the writing voltage or rise of an operation temperature, etc. So the applied condition is a longer voltage application time, a higher writing voltage or a higher temperature during the writing than the write operation for a usual 1-write operation.

Next, a read operation is performed, and the memory cells in the 1-state M11 are detected as normal cells and the memory cells not in the 1-state (M21 or M31) are detected as an abnormal cell. Furthermore, address information of each abnormal cell is extracted in this example, though the particularized extraction of address information for the abnormal cell(s) can be omitted in some examples of this embodiment. In a normal write operation to a normal cell, the magnetization direction of the reference layer 12d is not reversed, but magnetization direction of the storage layer 12b is reversed in the normal cell (see transition of M0 to M11 in FIG. 8). But for an abnormal cell, the magnetization directions of both the storage layer 12b and the reference layer 12d are not reversed by a normal 1-state writing operation, like for abnormal cell-type M21 (see transition M0 to M21 in FIG. 8), or alternatively, the magnetization directions for both the reference layer 12d and the storage layer 12b are reversed by the normal 1-state writing operation, like for the abnormal cell-type M31 (see transition M0 to M31 in FIG. 8). Here, a reversal of the magnetization direction means that an angle between a main surface of the magnetic tunnel junction element 10 and the magnetization direction changes more than 90 degrees.

Next, in the screening process it is judged whether the abnormal cell has a M21 state or a M31 state.

First, magnetization state for each abnormal cell is initialized. Here, the initialization process is that a large external magnetic field is applied to the abnormal cell, and the magnetization directions of the shift-cancelling layer 12f, the reference layer 12d and the storage layer 12b are thus controlled. Each of these layers has a different magnetic field required to reverse its magnetization direction (a coercive force) and the shift-cancelling layer 12f has the largest coercive force of these layers. The magnetic direction of each layer in a layer stack of the magnetic tunnel junction element 10 can be aligned by application of a magnetic field larger than the coercive force of the shift cancelling layer 12f. In this example, the magnetic directions for the shift-cancelling layer 12f, the reference layer 12d and the storage layer 12b are each intended to be downward.

Next, the magnetic directions of only the reference layer 12d and the storage layer 12b are reversed, and the reference layer 12d and the storage layer 12b thus have an opposite magnetic direction to the shift-cancelling layer 12f (see M22, M32 in FIG. 8). This process is performed by application of a magnetic field which is smaller than the coercive force of the shift-cancelling layer 12f, but larger than the nominal coercive force of the reference layer 12d and the storage layer 12b. With this, the magnetic tunnel junction element should become a 0-state.

Finally, a write operation to the 1-state is performed again. This write operation is performed as a usual write operation to prevent the magnetization direction of the reference layer 12d from reversing. So this write operation is performed under conditions such that the voltage application time is shorter, the writing voltage is lower or the temperature is lower than the initial write operation used to place the memory cells in the M0-state at the beginning of the screening process. The write operation to the M0-state is performed under conditions that can cause the reference layer 12d to easily degrade as referred to above, for example, repeated the writing operations. On the other hand, it is generally difficult to cause the reversal of the magnetic directions of the reference layer 12d by the usual (normal) write operation. If the memory cell is in the 1-state (e.g., state M33 in FIG. 8) after this usual write operation, the memory cell is an abnormal cell with a defect caused by a reversal of the reference layer 12d. If the memory cell is not in the 1-state (e.g., state M23 in FIG. 8) after the usual write operation, this memory cell is an abnormal cell having a defect not caused by reversal of the reference layer 12d. In this way it is possible to distinguish between the abnormal cell state types M21 and M31.

Referring back to FIG. 7, if it is judged that there are no abnormal cells in screening test described in conjunction with FIG. 8, a writing voltage V1 is applied to all the bit lines BLs (S2) and the write operation has finished. That is, if it is judged that there are no M21 or M31 type abnormal cells, a write operation S2 is performed using a writing voltage level at writing voltage V1 (e.g., a normal writing voltage).

However, if it is judged that there is an abnormal cell type M31, a writing voltage V2 (for example 1.3V) that is higher than the writing voltage V1 is applied to all the bit lines BLs.

The screening test is performed once and then a writing voltage based on the screening test (V1 or V2) is applied in the write operation after this.

Below the reason why the writing voltage V2 higher than the writing voltage V1 is applied is described in conjunction with FIG. 9 and FIG. 10.

Figure 9:
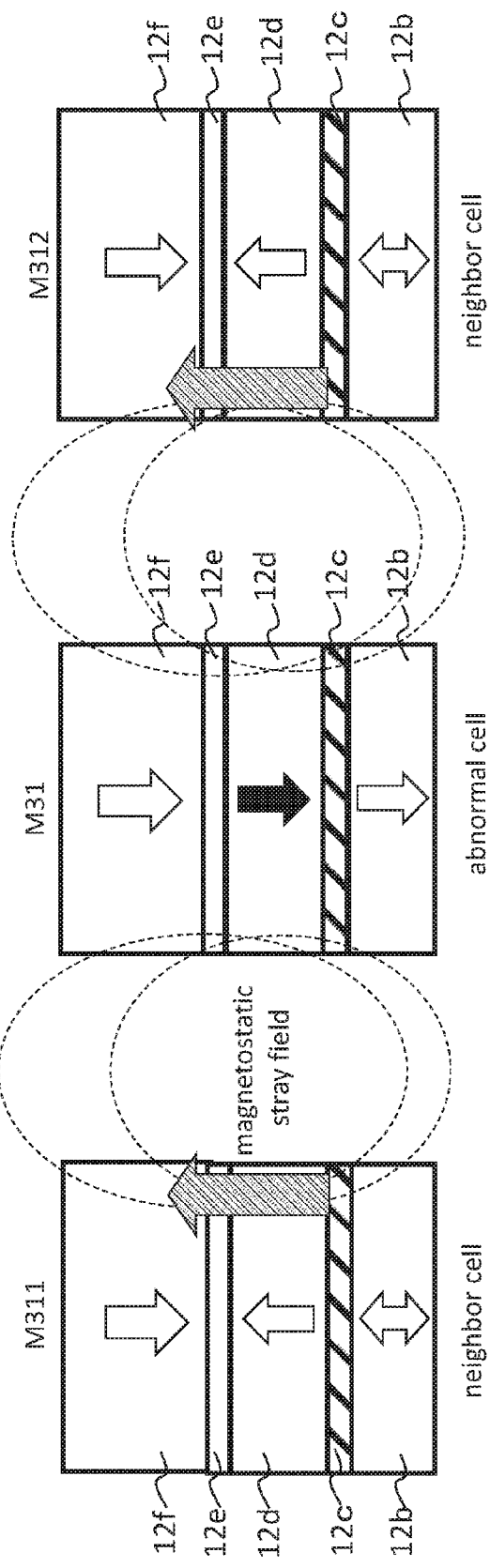
FIG. 9 is an illustration depicting aspects of a write operation of a magnetic memory device according to first embodiment.
Figure 10:
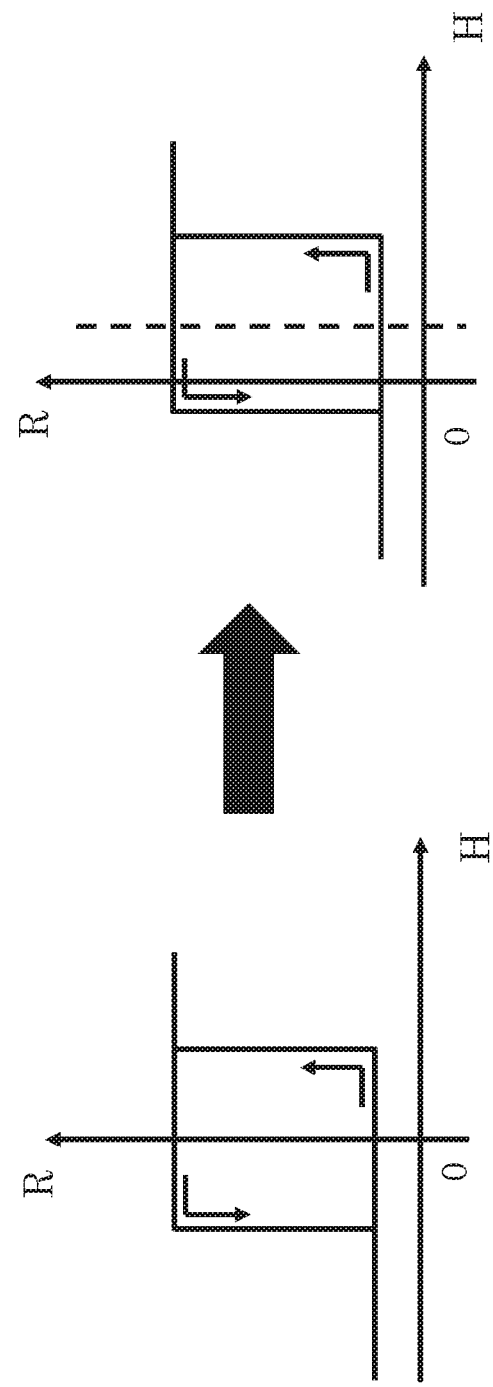
FIG. 10 is an illustration depicting aspects of a write operation of a magnetic memory device according to first embodiment.

FIG. 9 is an illustration showing the magnetization direction of an abnormal cell M31 and its neighbor cells M311 and M312 which are adjacent to the abnormal cell M31. FIG. 10 is a chart showing a hysteresis loop of the storage layer 12b of the neighbor cells (M311 and M312).

For example, the magnetization direction of the reference layer 12d in the abnormal cell M31 is reversed by degradation induced by high temperature, or accumulated total number of write operations and/or erase operations. The magnetization direction of the shift-cancelling layer 12f of the abnormal cell M31 is fixed to the downward direction, which is same as the reference layer 12d in the abnormal cell M31. So the magnetization of the reference layer 12d cannot be cancelled by the shift-cancelling layer 12f in this abnormal cell M31. That is, a magnetostatic stray field from this reference layer 12d and the shift cancelling-layer 12f pair exists and is shown by dashed lines in FIG. 9. It is presumed that a magnetostatic stray field from the abnormal cell M31 affects the neighboring cell M311 and M312 because of the close proximity of these memory cells.

An upward directed magnetic field is applied to the neighbor cell M311 and M312 by the magnetostatic stray field from the abnormal cell M31. Therefore, a hysteresis loop of the storage layer 12b of the neighbor cell M311/M312 is shifted to right as depicted in FIG. 10. This means that a larger magnetic field is needed to reverse the magnetic direction of the storage layer 12b in these neighboring cells. So a higher writing voltage needs to be applied to the neighbor cell(s) as compared to other normal cells that are not in close proximity (neighboring) to an abnormal cell M31. Therefore, the writing voltage V2 is used in a case in which the abnormal cell M31 exists nearby and the writing voltage V2 is higher than the writing voltage V1 which would be used if the abnormal cell M31 is absent.

Furthermore, the voltage of the bit line bBL (a source line) can be lowered, rather than changing the voltage applied to the bit line BL, in order to increase the writing voltage when an abnormal cell exists nearby in the write operation of the magnetic memory device.

According to the magnetic memory device in this first embodiment, the writing voltage is applied to the bit lines based on a magnetic property of the memory cell. It is possible to suppress writing failure by determining whether an abnormal cell exists with a magnetization direction that is reversed easily by degradation induced by high temperature or increasing number of times of the write operation or an erase operation having been performed. After that, if an abnormal cell is determined to exist, a higher writing voltage is applied to all the bit lines of the memory cells MC being written.

In addition to this, the above cited way can be performed relatively easily because a higher voltage can be applied to all the bit line at once.

Embodiment 2

Next, the magnetic memory device according the second embodiment will be described with reference to FIG. 11 and FIG. 12. The constitutions of the memory cell array 1 and the magnetic tunnel junction element 10 are as same as in the first embodiment, thus detailed explanation of these aspects will be omitted.

In the second embodiment, a writing voltage V2 is applied only to the bit lines that are connected to the neighboring cell(s) which are adjacent to an abnormal cell, but not to all the bit lines. This is different from the first embodiment.

Figure 11:
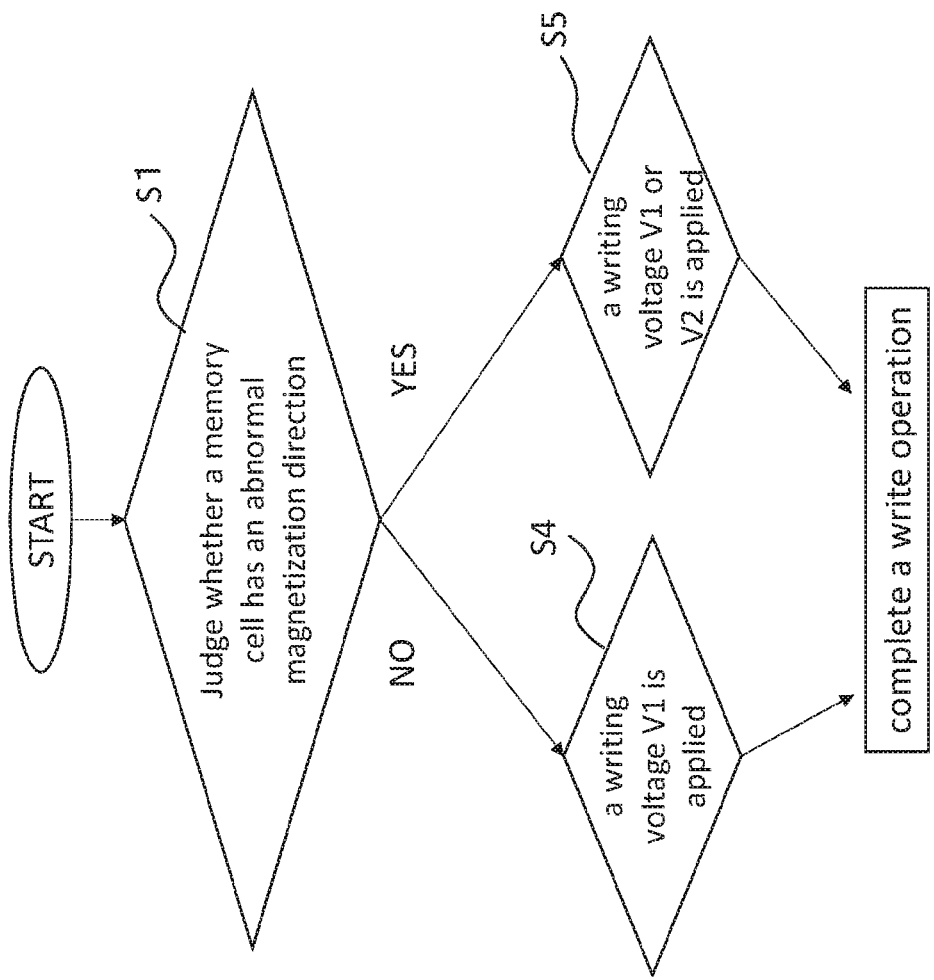
FIG. 11 is a flow chart of aspects of a write operation of a magnetic memory device according to second embodiment.

FIG. 11 is a flow chart showing a write operation according to the second embodiment. FIG. 12 is an illustration showing a memory cell array to explain that a bit line BL applies a writing voltage. Here, the specific number of the bit lines BL and the bit lines bBL depicted in FIG. 12 is different from in FIG. 1. However, FIG. 12 is just one example configuration, and the number of bit lines BL and bBL is not limited to this depicted number.

In FIG. 11, it is judged whether an abnormal cell (x) caused by reversal of the reference layer 12d exists by performing a screening as in the first embodiment (S1). If it is judged that there is no abnormal cell, the writing voltage V1 is applied to all the bit lines BL as in the first embodiment (S4).

Figure 12:
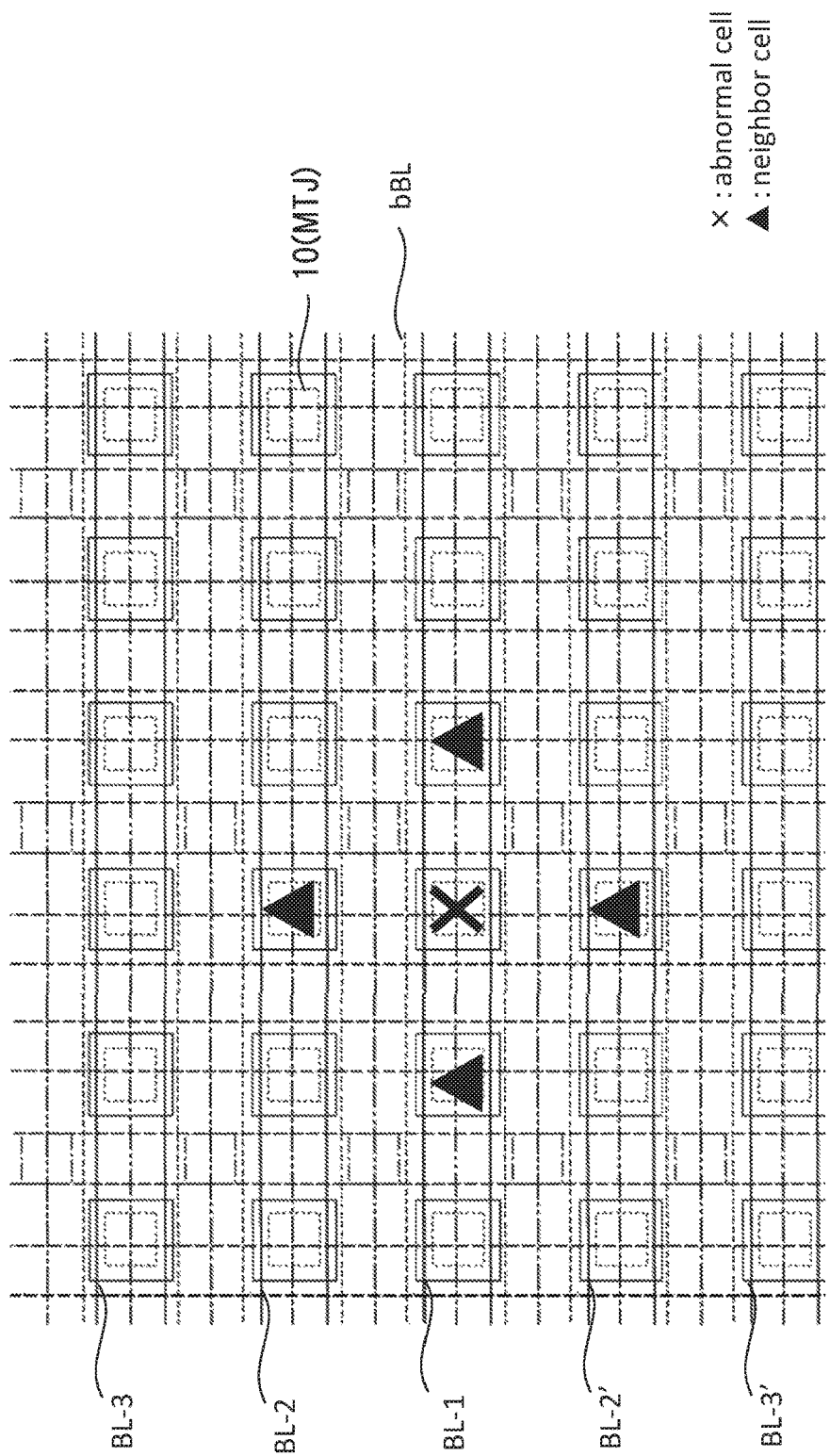
FIG. 12 is an illustration depicting aspects of a write operation of a magnetic memory device according to second embodiment.

On the other hand, if it is judged that there is the abnormal cell, then the higher writing voltage V2 (for example, 1.3V) rather than V1 is applied to the bit line BL-1 connected to the abnormal cell, and also the bit lines BL-2 and BL-2' connected to the cells (neighboring cells (▲)) which are located next to the abnormal cell in the row direction shown in FIG. 12. The reason why the higher writing voltage V2 is applied to the neighboring cells which are located next to the abnormal cell is as same as the first embodiment. However, unlike the first embodiment, the writing voltage V1 is applied to the other bit lines (e.g., BL-3 and BL-3') (S5) in the array.

According to the second embodiment, the higher writing voltage V2 is applied only to the specific bit lines BL connected to the neighbor cells and is not applied to the other bit lines BL connected only to the normal cells, which is unlike the first embodiment. Therefore, it is possible to suppress the reversal of the reference layer 12d of the normal cells that might be caused by a higher writing voltage.

Embodiment 3

Third embodiment will be described with reference to the FIG. 13. The third embodiment is different from the first embodiment and the second embodiment in application of a relief operation. In the relief operation, a region of the memory cell array 1 that is adjacent to or including the abnormal cell or the neighbor cells is replaced with another region, a redundancy region, of memory cell array 1.

Figure 13:
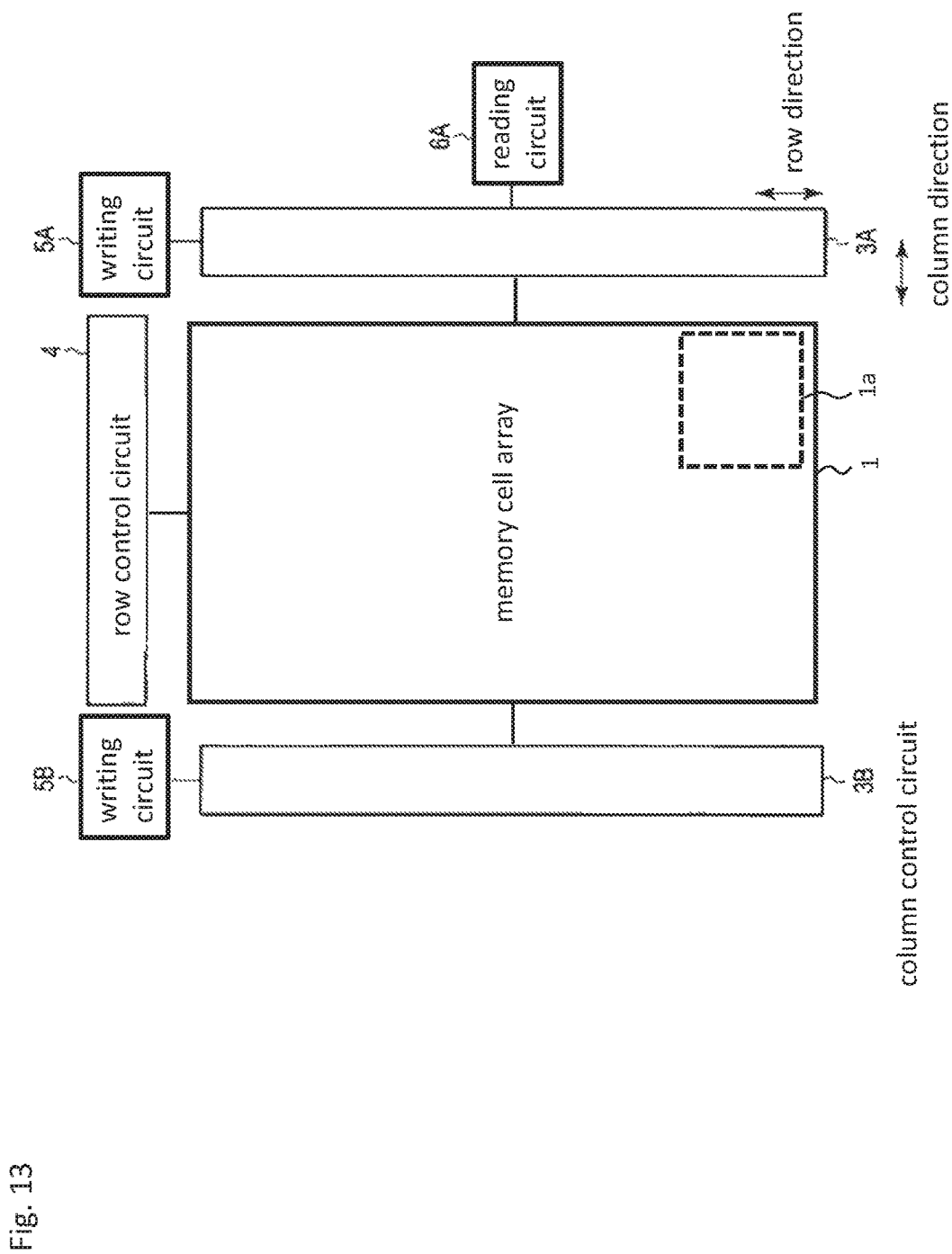
FIG. 13 is an illustration of a magnetic memory device according to third embodiment.
Figure 14:
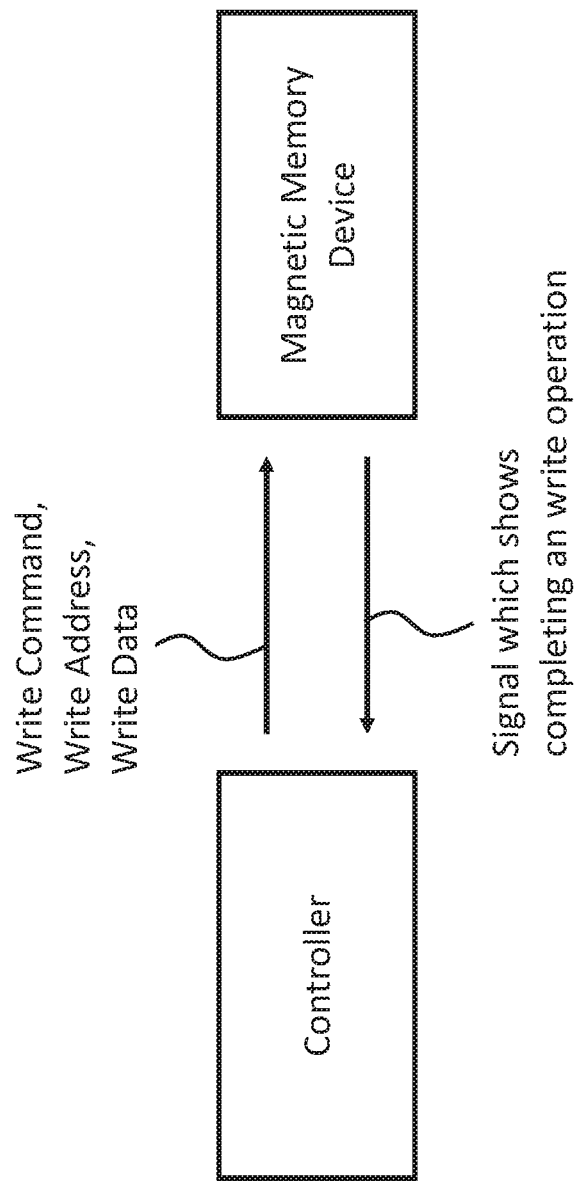
FIG. 14 is an illustration depicting aspects of a magnetic memory device and a controller according to first to third embodiments.

FIG. 13 is a schematic diagram showing the memory cell array 1 and the peripheral circuit(s) according to the third embodiment. In this third embodiment, the memory cell array 1 comprises a redundancy region 1a. Backup word lines and backup bit lines are provided in the redundancy region 1a for the cell failures in the memory cell array 1. Also, the redundancy region 1a can be provided outside of the memory cell array 1 rather than within memory cell array 1.

Next, the write operation in this third embodiment is explained.

It is judged whether the abnormal cell caused by reversal of the reference layer 12d exists by performing a screening as in the first embodiment and the second embodiment.

If it is judged that there is an abnormal cell, the bit lines connected to the abnormal cell and the neighbor cells located next to the abnormal cell in the row direction are replaced with bit lines of the redundancy region. Therefore, the abnormal cell and the neighbor cells are replaced with the new cells. The replacement process is controlled by the column control circuit 3 connected to the memory cell array 1. The writing voltage V1 can now be applied to all the bit lines BLs because the abnormal cell and its neighboring cells have been replaced.

If it is judged that there is no abnormal cell, the writing voltage V1 is applied to all the bit lines, without replacement/substitution, as in the first embodiment and the second embodiment.

According to this third embodiment, if an abnormal cell whose magnetization direction is reversed easily is present in the memory cell array 1, the bit lines BLs connected to this abnormal cell and its neighbor cells next to the abnormal cell are replaced with bit lines connected to cells in the redundancy region. In result, it is possible to suppress writing failures associated with the abnormal cell.

And, contrary to the first embodiment and the second embodiment, it is not necessary to adjust the voltages, etc. to account for the abnormal cell.

In the first to third embodiments, it has been depicted that the neighbor cells are next to the abnormal cell in four directions (e.g., see FIG. 12) and these neighbor cells are provided in each of the four directions and only the directly adjacent neighbor cell in each direction is considered neighboring. But this particular arrangement of the neighbor cells is not necessarily a limitation. The neighbor cells can be considered to be provided in within any range affected by the magnetostatic stray field of the abnormal cell(s).

The write operation in the first to third embodiments is explained as being performed by a control circuit in the magnetic memory device as an example. The write operation can instead be performed by a controller outside of the magnetic memory device instead of a control circuit included on the same substrate as the memory cell array 1. In this case, the controller may comprise a host central processor unit (CPU) and a memory controller, for example. When data is written into the magnetic memory device, the memory controller issues a write command and transfers it to the magnetic memory device. Furthermore, the memory controller transfers a write address and a write data to the magnetic memory device. The magnetic memory device transfers a signal which provides notice of completion of the write operation to the controller after acceptance/receipt of the write command.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device, comprising:
   a memory cell array comprising memory cells including magnetic tunnel junction elements, each memory cell electrically connected between a source line and a bit line; and
   a control circuit configured to:
      perform a screening test on the memory cell array before writing data to the memory cell array, the screening test determining whether any of the memory cells in the memory cell array is an abnormal cell, and then apply a first writing voltage to write data to the memory cell array if none of the memory cells is determined to be an abnormal cell, or apply a second writing voltage to write data to the memory cell array if any of the memory cells is determined to be an abnormal cell, the second writing voltage being different from the first writing voltage, wherein during the screening test, the control circuit applies a writing voltage to the memory cells that are in a 0-state and determines a memory cell to be an abnormal cell if the memory cell is in the 0-state immediately after the writing voltage is applied.

2. The magnetic memory device of claim 1, wherein the second writing voltage is higher than the first writing voltage.

3. The magnetic memory device of claim 1, wherein the control circuit is configured to perform the screening test each time a writing operation is instructed prior to the writing operation.

4. The magnetic memory device of claim 1, wherein the control circuit is configured to apply the first writing voltage to a first bit line and the second writing voltage to a second bit line, the second bit line being connected to a detected abnormal cell, and the first bit line being connected to a memory cell that is not adjacent to the detected abnormal cell.

5. The magnetic memory device of claim 4, wherein the control circuit is configured to apply the second writing voltage to a third bit line that is connected to a neighboring memory cell that is adjacent to the detected abnormal cell in a column direction.

6. The magnetic memory device of claim 1, wherein each magnetic tunnel junction element comprises a first magnetization film, a second magnetization film, and a first non-magnetization film between the first magnetization film and the second magnetization film.

7. The magnetic memory device of claim 1, wherein the control circuit is controlled by signals received from an external controller outside the magnetic memory device.

8. The magnetic memory device of claim 1, wherein each magnetic tunnel junction element is connected between the bit line and the source line, and the control circuit is configured to apply the second writing voltage to the memory cells by changing a voltage applied to the source line.

9. The magnetic memory device of claim 1, wherein each magnetic tunnel junction element includes:
a first electrode,
an underlayer on the first electrode,
a magnetic storage layer on the underlayer,
a tunnel barrier layer on the magnetic storage layer,
a magnetic reference layer on the tunnel barrier layer,
a spacer layer on the magnetic reference layer,
a shift-cancelling layer on the spacer layer, and
a second electrode on the shift-cancelling layer.

10. A magnetic memory device, comprising:
a memory cell array comprising memory cells including magnetic tunnel junction elements, each memory cell electrically connected between a source line and a bit line, the memory cell array including a first region and a second region, the second region being a redundancy region of the memory cell array; and
a control circuit configured to:

perform a screening test on the first region of memory cell array before writing any data addressed to the first region of the memory cell array, the screening test determining whether any of the memory cells in the first region of the memory cell array is an abnormal cell, and then write data to the second region if any of the memory cells in the first region is determined to an abnormal cell, wherein each magnetic tunnel junction element includes:
a first electrode,
an underlayer on the first electrode,
a magnetic storage layer on the underlayer,
a tunnel barrier layer on the magnetic storage layer,
a magnetic reference layer on the tunnel barrier layer,
a spacer layer on the magnetic reference layer,
a shift-cancelling layer on the spacer layer, and
a second electrode on the shift-cancelling layer.

11. The magnetic memory device of claim 10, wherein the first region of the memory cell array includes any memory cells directly adjacent to an abnormal cell, and any data to be written to the memory cells directly adjacent to the abnormal cell is written to the second region when the abnormal cell is present in the first region.

12. The magnetic memory device of claim 10, further comprising:
an external controller connected to the control circuit and configured to provide signals to the control circuit including a write command, a write address, and write data.

13. A writing operation control method of a magnetic memory device, comprising:
performing a screening test on a memory cell array before writing data to the memory cell array, the memory cell array comprising memory cells including magnetic tunnel junction elements, each memory cell being electrically connected between a source line and a bit line, the screening test determining whether any of the memory cells in the memory cell array is an abnormal cell; and writing the data to the memory cell array by applying a first voltage to a first memory cell in the memory cell array if none of the memory cells is determined to be an abnormal cell, and applying a second voltage to the first memory cell if any of the memory cells is determined to be an abnormal cell, the second voltage being different than the first voltage, wherein performing the screening test comprises:
executing a first write operation intended to write each memory cell in the memory cell array to a 1-state value;
executing an initialization process on each memory cell still having a detected 0-state value after the first write operation, the initialization process including applying a first magnetic field to each memory cell having the previously detected 0-state value, then a second magnetic field to each memory cell having the previously detected 0-state value, the first magnetic field being stronger than the second magnetic field;
executing a second write operation on initialized memory cells intended to write 1-state data to the initialized memory cells; and
executing a read operation on the memory cells written in the second write operation.

14. The writing operation control method according to claim 13, wherein a voltage in the second write operation is higher than in the first write operation.

15. The writing operation control method according to claim 13, wherein the second voltage is applied to each memory cell in the memory cell array in the writing of data to the memory cell array after the screening test.

16. The writing operation control method according to claim 13, wherein, when an abnormal cell is present in the memory cell array, the second voltage is applied to the abnormal cell and memory cells adjacent to the abnormal cell and the first voltage is applied to memory cells other than the abnormal cell and the memory cells adjacent to the abnormal cell in the writing of data to the memory cell array after the screening test.

17. The writing operation control method according to claim 16, wherein the memory cells adjacent to the abnormal cell includes at least one memory cell on a bit line that is different from a bit line connected the abnormal cell.

* * * * *